(12) United States Patent
Nilsson

(10) Patent No.: US 7,535,304 B2
(45) Date of Patent: May 19, 2009

(54) AMPLIFIER COUPLING ON A REDUCED AREA

(75) Inventor: Ulf Joakim Nilsson, Molnda (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 91 days.

(21) Appl. No.: 11/576,223

(22) PCT Filed: Sep. 30, 2004

(86) PCT No.: PCT/SE2004/001391

§ 371 (c)(1),
(2), (4) Date: Mar. 28, 2007

(87) PCT Pub. No.: WO2006/036091

PCT Pub. Date: Apr. 6, 2006

(65) Prior Publication Data

US 2008/0061882 A1    Mar. 13, 2008

(51) Int. Cl.
*H03F 3/68*   (2006.01)
(52) U.S. Cl. .................................................... 330/295
(58) Field of Classification Search ............. 330/124 R, 330/295
See application file for complete search history.

(56) References Cited

U.S. PATENT DOCUMENTS 3,292,094 A * 12/1966 Jones .......................... 330/273
4,755,769 A *  7/1988 Katz ........................... 330/295

* cited by examiner

*Primary Examiner*—Steven J Mottola
(74) *Attorney, Agent, or Firm*—Roger S. Burleigh

(57) ABSTRACT

The invention discloses an amplifier (200, 400, 500) coupling comprising a first (230), a second (240), a third (250) and a fourth (260) transistor, additionally comprising a signal input port (220) and a signal output port (210, 410). The input port of the amplifier is connected to the first, second, third and fourth transistors such that an input signal to the amplifier is input to the first and the fourth transistor in parallel, and to the second and third transistors in parallel, with the outputs from the first and second transistors being connected in series to each other, and the outputs from the fourth and third transistors being connected in series with each other, said outputs being connected in parallel to each to the one output port of the amplifier.

3 Claims, 6 Drawing Sheets

AMPLIFIER COUPLING ON A REDUCED AREA

TECHNICAL FIELD

The present invention discloses an amplifier coupling which comprises a first, a second, a third and a fourth transistor, and also comprises a signal input port and a signal output port.

BACKGROUND ART

In high power amplifiers such as those used in, for example, microwave applications in MMIC-technology (Monolithic Microwave Integrated Circuit), the number and layout of the transistors which are used for each amplifier is such that the surface area which is necessary to house the amplifiers increases, which causes a corresponding increase in cost since the chip cost is in direct proportion to the chip surface used. This cost becomes increasingly higher as higher and higher power levels are used.

DISCLOSURE OF INVENTION

As discussed above, there is a need for an amplifier which would offer at least the same degree of amplification and output power as the amplifiers known at present, but which would cover a smaller surface of a chip or substrate.

This need is addressed by the present invention in that it offers an amplifier coupling which comprises a first, a second, a third and a fourth transistor.

The amplifier of the invention additionally comprises a signal input port and a signal output port, with the input port of the amplifier being connected to the first, second, third and fourth transistors such that an input signal to the amplifier is input to the first and the fourth transistor in parallel, and to the second and third transistors in parallel.

The outputs from the first and second transistors are connected in series to each other, and the outputs from the fourth and third transistors are also connected in series with each other, said outputs being connected in parallel to each other and then to the output port of the amplifier.

Due to this design of the amplifier of the invention, a more efficient use of chip surface than previously becomes possible, as will become apparent from the following detailed description.

BRIEF DESCRIPTION OF THE DRAWINGS

The invention will be described in more detail below, with reference to the appended drawings, in which.

EMBODIMENTS

Figure 1:
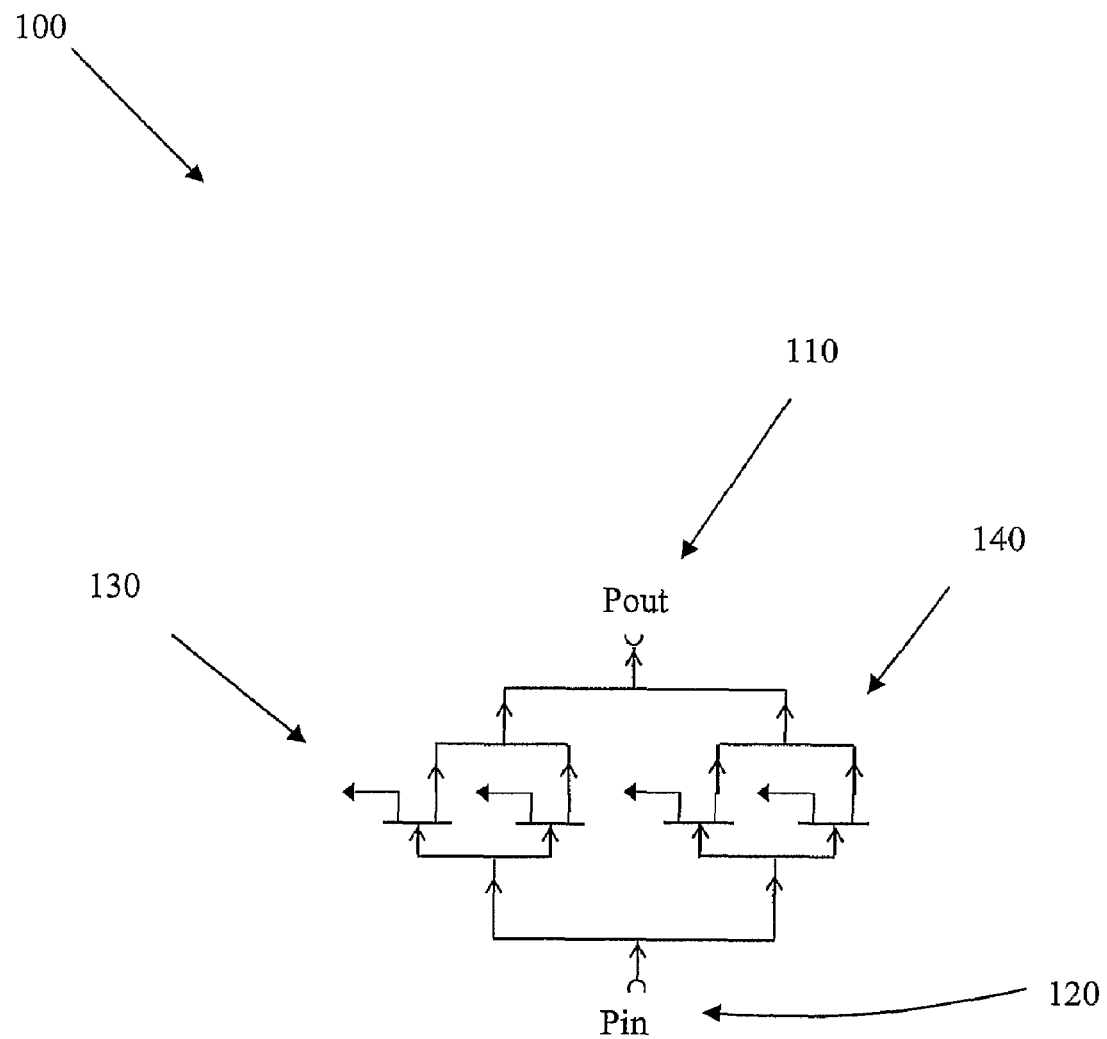
FIG. 1 shows an amplifier according to prior art.

FIG. 1 shows a circuit 100 which is a power amplifier according to known technology. As can be seen, the amplifier 100 comprises two "transistor blocks" 130, 140, which are identical to each other. The amplifier 100 also comprises a signal input port 120 and a signal output port 130.

As can be seen from FIG. 1, each transistor block 130, 140, comprises two transistors, which in the example shown are FET-transistors, but which could also be other types of transistors, for example bipolar transistors. The two transistors in each block are connected such that an incoming signal is split equally between the input of each transistor, in the case of a FET-transistor, the gate of the FET. The outputs of each transistor in the block, in the case of a FET the drain, are also connected to each other to form an output from the block, which is then, in turn, connected to the output port of the amplifier 110.

The third port of the FET, the source, is connected to ground, as indicated in FIG. 1 by means of an arrow. The ground connection can be direct, through a via hole or via a circuit such as, for example, a capacitor, a coil or a resistor, or a combination of such elements.

The two transistor blocks 130, 140, are connected to the signal input port 120 in such a way that a signal from the input port 120 is split by means of a feeder network and reaches each block with essentially one and the same phase. In a similar manner, signals which are output from the two transistor blocks 130, 140 reach the output port 110 of the amplifier with essentially one and the same phase since the outputs from the two blocks are connected to the output port 110 by means of an output network which is identical from each block output to the port 110.

The coupling between the blocks as shown in FIG. 1, in combination with the internal design of each block works well, but which in combination with the necessary distribution networks and feeder networks creates a need for a resulting circuit which is rather wide, and thus requires a rather large amount of area on a chip or some other form of supporting substrate, which causes a circuit which comprises a large number of such blocks to become expensive.

Figure 2:
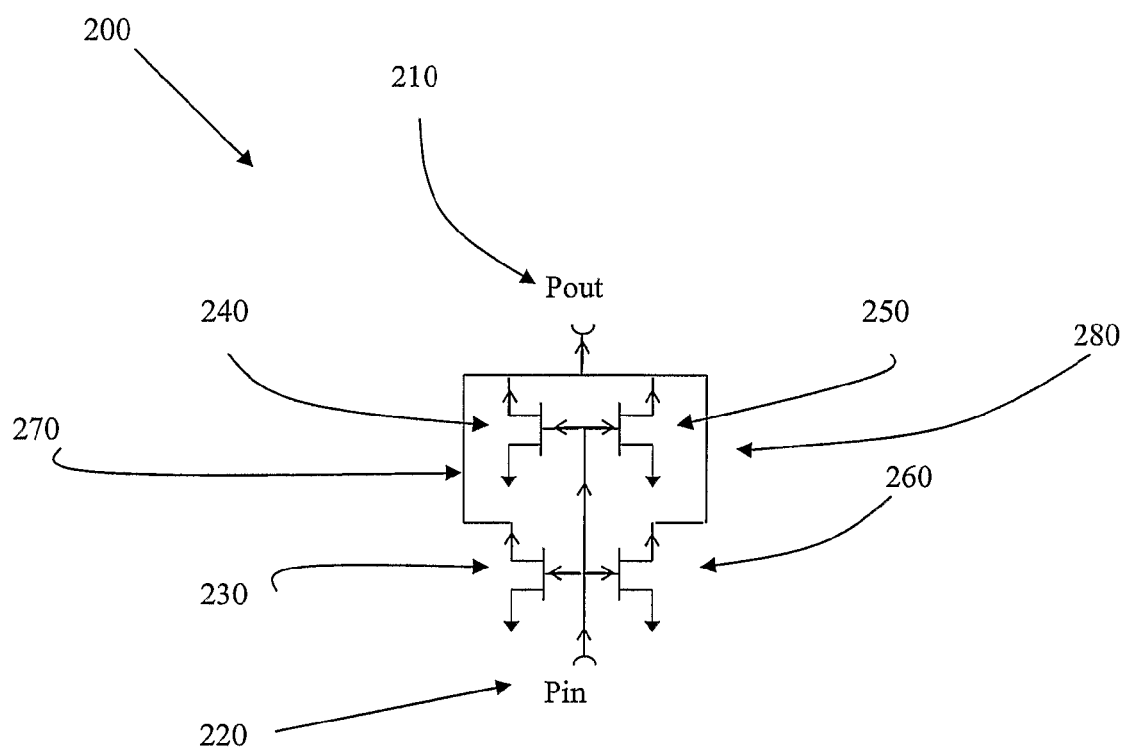
FIG. 2 shows an amplifier coupling according to the invention.

FIG. 2 shows an amplifier coupling 200 according to the invention. As can be seen, the amplifier 200 of the invention comprises, in similarity to the known amplifier 100 of FIG. 1, a first transistor 230, a second transistor 240, a third transistor 250 and a fourth transistor 260.

In addition, the amplifier 200 comprises a signal input port 220 and a signal output port 210. As shown in FIG. 2, and illustrated in more detail in FIG. 3, the input signal to the first 230 and fourth 260 transistors is input via a first common point 345 to which the input port $P_{in}$ is serially connected, and the input signal to the second 240 and third 250 transistors is input via a second common point 355, which is serially connected to the first common point 345.

Thus, an input signal from the input port 220 is coupled to the inputs of the first 230 and fourth 260 transistors in parallel, as is also the case for input signals which are input to the second 240 and third 250 transistors.

Accordingly, as shown in FIG. 2, the gates of the FET:s are used as input ports in the amplifier 200, so that the gates of the first 230 and fourth 260 transistors share input signals, as do the second 240 and third 250 transistors. Thus, in the embodiment shown in FIG. 2, the amplifier input 220 is serially connected to the first common point 345, from which the first 230 and fourth 260 transistors are fed, and then to the second common point 355 from which the second 240 and third 250 transistors are fed.

The source of each of the four transistors is connected to ground, in the same manner as described above in the amplifier 100. The outputs, in this case the drain, of the first and second transistors are serially connected to each other via a first feed line 270, which is then connected to the signal output port 210 of the amplifier 200. In a similar manner, the outputs, the drain, of the third and fourth transistors are serially connected to each other via a second feed line 280, which is then also connected to the signal output port 210 of the amplifier 200.

Thus, the outputs of the first and second transistors are connected serially to each other, as are the outputs of the third and fourth transistors. Each output combination is then connected to the output port 210 of the amplifier, so that the outputs of the two transistor pairs, i.e. the first and second, and the third and fourth respectively, are connected in parallel to each other and then to the output port 210 of the amplifier.

Figure 4:
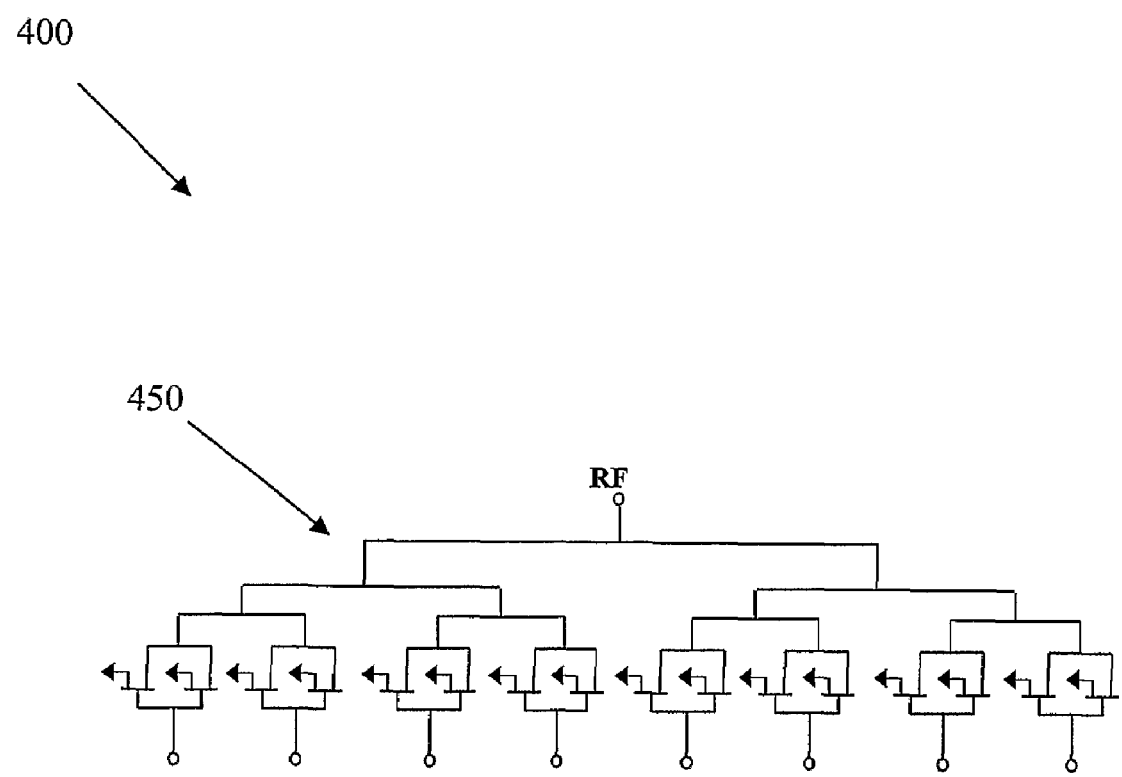
FIG. 4 shows an amplifier network according to prior art.

In FIG. 4, there is shown an amplifier circuit 400 according to known technology. Accordingly, the amplifier 400 uses the transistor "blocks" shown in FIG. 1. As will become apparent from FIG. 4, the known amplifier 400 will become rather wide, occupying a rather large space on a chip or other substrate, and the combining/matching network 450 which combines the outputs from the blocks to the total output of the amplifier will become quite complex. Another disadvantage of the known amplifier 400 is that it can only consist of an amount of $2^x$ of transistors.

Figure 5:
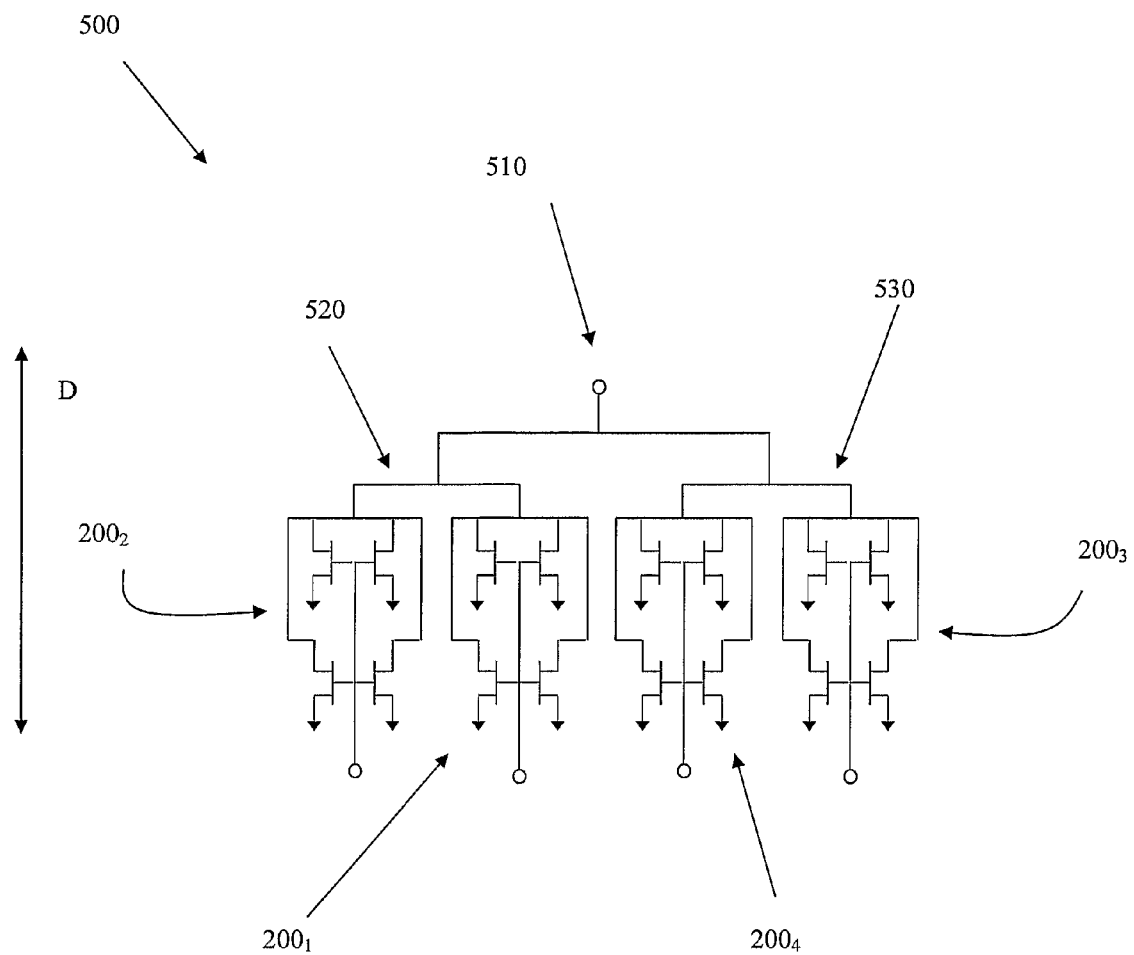
FIG. 5 shows an amplifier network using the invention.

In FIG. 5 there is shown an amplifier 500 using the amplifier circuit 200 of the invention. In order to facilitate easy comparison, the amplifier 500 has the same amount of transistors as the known amplifier 400 in FIG. 4, i.e. sixteen transistors, thus four circuits $200_1$-$200_4$ according to the invention are used, connected in parallel, the outputs from the four circuits $200_1$-$200_4$ being connected in parallel in "steps" of two.

As becomes apparent from FIG. 5, the amplifier 500 which uses the invention, will become narrower than the known amplifier 400, and thus use a smaller surface area on a chip. This is also due to the fact that the amplifier 500 will need a less complicated feed network and combining network on the output side.

In addition, it would be possible to expand the amplifier which uses the invention in the "depth" dimension, indicated by the arrow D in FIG. 5, which would not be possible with previously known amplifiers. Thus, each such expanded circuit $200_1$-$200_4$ could comprise six transistors, connected in a manner analogous to that of the transistors in the circuit 200.

Figure 6:
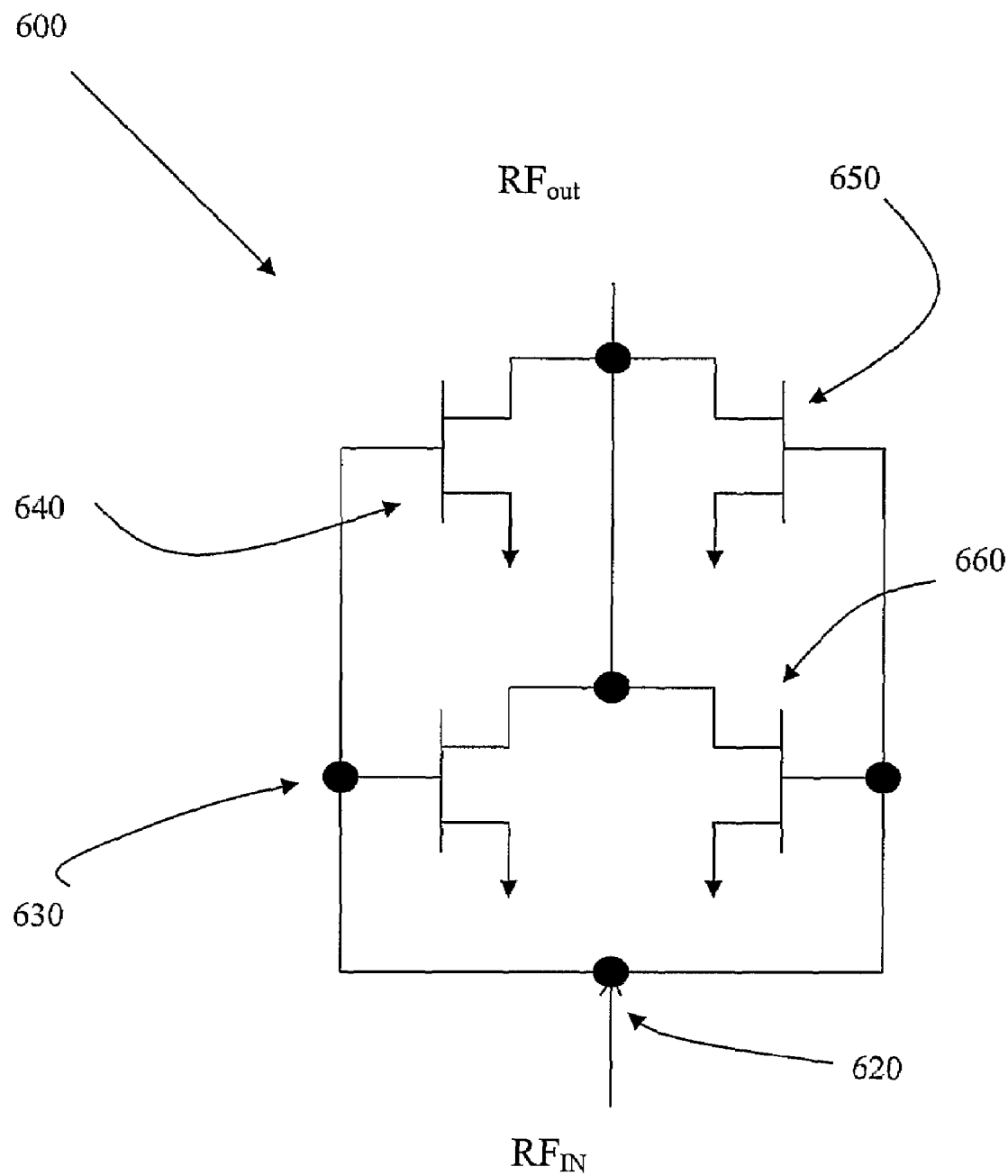
FIG. 6 shows an alternative version of the amplifier coupling according to the invention.

FIG. 6 shows an alternative version 600 of the circuit according to the invention. In this version of the amplifier of the invention, the connections are slightly different, so that an incoming signal is still input to the first 630 and fourth 660 transistors in parallel, but in this embodiment an incoming signal to the input port 620 is split up at the input 620 before it reaches the inputs of the first 630 and fourth 660 transistors.

This is also the case for the second 640 and third 650 transistors, i.e. they are still connected in parallel with regard to incoming signals, but they are reached by a signal which has been split at the input 620 before it reaches them. In this embodiment, the inputs to the second 640 and third 650 transistors are "farther down the line" of the split signals which reach the first 630 and fourth 660 transistors respectively.

In similarity to the previously shown embodiments of the invention, in the amplifier 600 the outputs from the first 630 and second 640 transistors are connected to each other in series, as are the outputs of the third 650 and fourth 660 transistors second. Thus, two output pairs are created, which are connected in parallel to each other and then to the output of the amplifier.

Reverting now to the known amplifier in FIG. 1, as has been pointed out in the description of that amplifier, signals which are input to the transistors of that amplifier will all reach the output of the amplifier with essentially one and the same phase. This is not necessarily the case with the amplifiers of the invention, as will become apparent by, for example, looking at FIG. 3: the electrical distance between the first and second points 345, 355, may cause a phase difference in the input signals.

The phase differences may cause a slight deviation from the maximal gain which would be possible to obtain by means of the amplifier. If it is desired to correct this phase difference, to obtain essentially the same phase from all of the transistors of the amplifier at the output port of the amplifier, the phase difference can rather easily be compensated for.

Figure 3:
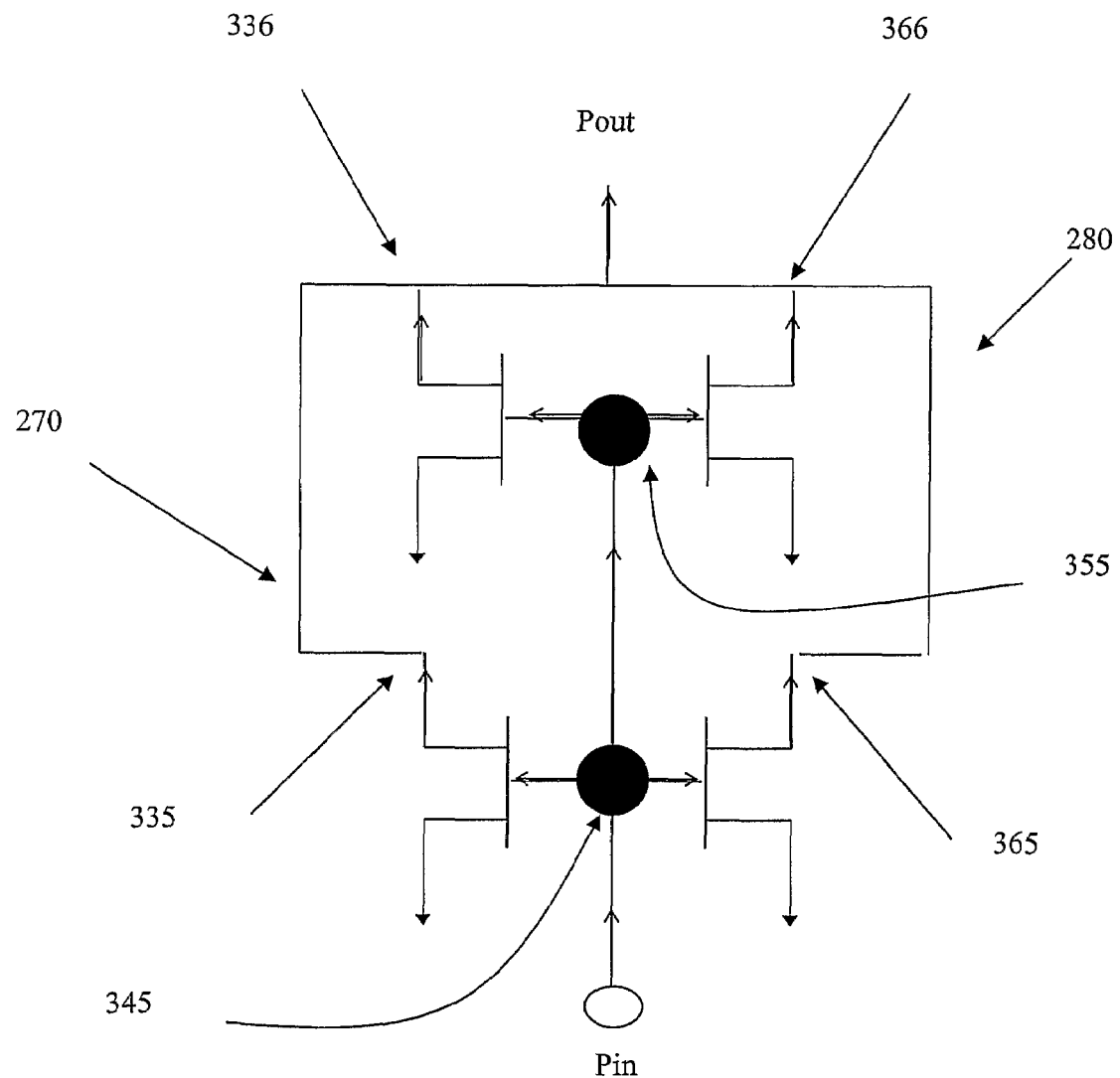
FIG. 3 shows an enlarged view of some details of an amplifier coupling according to the invention.

In order to adjust or compensate for the phase difference described, in the embodiment of the invention shown in FIGS. 2, 3 and 5, the electrical lengths between the output pairs which are combined must be essentially the same as the electrical distance between the two common points 345, 355.

In FIG. 3, the outputs which are combined are shown with arrows, the electrical distance between the outputs of the first and second transistors being the electrical distance between the arrows 335 and 336, and the electrical distance between the outputs of the third and fourth transistors being the electrical distance between the arrows 365 and 366. The first common point is shown as 345 and the second common point as 355.

As explained previously, in order to achieve low or zero phase differences, the electrical distance between the first and second common points 345 and 355 needs to be the same as that between points 335 and 336 and that between 365 and 366 respectively. This can be accomplished in a wide variety of ways, as known to those skilled in the field, one way being to introduce resistances in those connections which are mechanically longer. Other ways to achieve the same goal, i.e. similar electrical distances, are well known to those skilled in the field, and will thus not be described in further detail here.

As shown in FIG. 3, there is a short distance between the transistor outputs 336 and 366 and the amplifier output port 210. These two distances should also be the same in order to avoid phase differences.

Regarding the phase compensation issue, in a corresponding manner, as will be understood by one skilled in the art, corresponding compensations can be made in the embodiment shown in FIG. 6, so that signals "travelling" through the first and second transistors and the third and fourth transistors respectively, will cover the same electrical distances.

The invention is not limited to the example of embodiments shown above, but can be freely varied within the scope of the appended claims. For example, the transistors employed in the amplifier of the invention don't need to be FET-transistors, they can be virtually any other kind of transistor such as, for example, bipolar transistors.

With reference to FIG. 3, the signal which is fed to all four transistors may be taken from one common point in the middle of the conductor, between points 345 and 355.

The invention claimed is:

1. An amplifier coupling, comprising a first, a second, a third and a fourth transistor, additionally comprising a signal input port and a signal output port, wherein the input port of the amplifier is connected to the first, second, third and fourth transistors such that an input signal to the amplifier is input to the first and the fourth transistor in parallel and to the second and third transistors in parallel, with the outputs from the first and second transistors being connected to each other at a first output common point, and the outputs from the fourth and third transistors being connected with each other at a second common output point, said first and second common output points being connected to each other to form the output port of the amplifier;

wherein the inputs to the first and fourth transistors are from a first common input point in the amplifier, said first common input point being connected to a second common input point from which the input signal is input to the second and third transistors.

2. The amplifier of claim 1, wherein the signal input port of the amplifier is connected to each of the first, second, third and fourth transistors such that an input signal is input to the first and the fourth transistor with a first phase and to the second and third transistor with a second phase, said first and second phases being different from each other, and the signal output port of the amplifier is connected to the first, second, third and fourth transistors such that signals output from the first, second, third and fourth transistors reach the output port of the amplifier with essentially one and the same phase.

3. The amplifier of claim 2, wherein the signals from the first, second, third and fourth transistors reach the output port of the amplifier with essentially one and the same phase by virtue of the fact that the electrical length from the first common input point to the second common input point is equal to the electrical length from the output of the first transistor to the output of the second transistor and also equal to the electrical length from the output of the third transistor to the output of the fourth transistor.

* * * * *

UNITED STATES PATENT AND TRADEMARK OFFICE
CERTIFICATE OF CORRECTION

PATENT NO. : 7,535,304 B2 Page 1 of 1
APPLICATION NO. : 11/576223
DATED : May 19, 2009
INVENTOR(S) : Nilsson It is certified that error appears in the above-identified patent and that said Letters Patent is hereby corrected as shown below:

On the Face Page, in Field (75), under "Inventor", in Column 1, Line 1, delete "Molnda" and insert -- Mölndal --, therefor.

Signed and Sealed this

Seventeenth Day of November, 2009

David J. Kappos
*Director of the United States Patent and Trademark Office*